(12) United States Patent
McHugh et al.

(10) Patent No.: US 7,038,919 B2
(45) Date of Patent: May 2, 2006

(54) IC SOCKET HAVING FASTENING MECHANISM FOR SENSOR

(75) Inventors: Robert G. McHugh, Golden, CO (US); Sung-Pei Hou, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 215 days.

(21) Appl. No.: 10/672,143

(22) Filed: Sep. 25, 2003

(65) Prior Publication Data
US 2005/0068753 A1   Mar. 31, 2005

(51) Int. Cl.
*H01R 12/16* (2006.01)
(52) U.S. Cl. .......................... 361/785; 361/704; 439/66; 439/70; 439/71
(58) Field of Classification Search ................ 361/785, 361/776, 789, 764, 704–705; 439/359, 485, 439/66, 526, 71, 331; 257/719
See application file for complete search history.

(56) References Cited

U.S. PATENT DOCUMENTS 4,422,703 A * 12/1983 Christensen et al. ........ 439/266
5,100,332 A    3/1992  Egawa
5,573,418 A *  11/1996  Matsuoka ................... 439/331
5,609,497 A    3/1997  Kawabe
5,630,735 A *  5/1997  Eckert ........................ 439/721
6,607,396 B1 * 8/2003  Ito ............................... 439/331
6,744,269 B1 * 6/2004  Johnson et al. ............. 324/760

* cited by examiner

*Primary Examiner*—Kamand Cuneo
*Assistant Examiner*—Hung S. Bui
(74) *Attorney, Agent, or Firm*—Wei Te Chung

(57) ABSTRACT

An IC socket (10) includes an insulative housing (12) mounted on a burn-in board, a plurality of conductive contacts (14) received in the housing. The housing defines a recessed area (120) bounded by two pairs of sidewalls (122), the recessed area defining a plurality of passageways therein. One of the sidewalls fabricates a receiving channel (1220) substantially parallel to an upper surface of the recessed area and a fastening channel (1222) substantially perpendicularly communicating with the receiving channel. A bolt (16) is screwed in the fastening channel. When the IC socket is used, a sensor (20) is received in the receiving channel and restricted in the proper position by the bolt screwed in the fastening channel.

14 Claims, 5 Drawing Sheets

IC SOCKET HAVING FASTENING MECHANISM FOR SENSOR

BACKGROUND OF THE INVENTION

1. Field of the Invention

The present invention relates to an integrated circuit (IC) socket having a fastening mechanism for reliably fastening a sensor therein.

2. Description of the Prior Art

Electronic packages, such as integrated circuits (ICs), are miniaturized electronic devices in which a number of active and passive circuit elements are located on or within a continuous body of material to perform the function of a complete circuit. To ensure reliability of ICs prior to marketing, they are required to be burned in. That is, the ICs are operated at high temperature for an extended period of time in order to accelerate any dormant failure mechanisms that may be present. This is intended to eliminate early product failures once the ICs are sold and assembled into end products. A burn-in socket is used to receive an IC therein, so that the IC is electrically connected with a burn-in board.

Conventional IC sockets are disclosed in U.S. Pat. Nos. 5,609,497 and 5,100,332. Each typical such kind of IC socket comprises a base, a cover pivotally mounted on one side of the base, and a plurality of electrical contacts received in the base. The base comprises a loading table in a middle thereof for loading an IC thereon, and a lip on an end thereof. The contacts are mounted around the loading table. Each contact comprises a flexible contact portion exposed above a top of the base, and a tail exposed below a bottom of the base. Therefore, the tail is liable to be damaged during shipping of the IC socket. The cover comprises a frame mounted on the base, a securing portion mounted in a middle of the frame, and a hook movably mounted on an end of the frame. The hook comprises a clasp on an end thereof, for engaging with the lip of the base. The securing portion defines a general rectangular cavity, and provides pressing portions around the cavity.

In use, firstly the cover is oriented perpendicularly to the base. The IC is attached on the loading table of the base, and a lead of each circuit of the IC is attached on the contact portion of a corresponding contact. Then, the cover is rotated downwardly to a horizontal position, with the clasp of the hook clasping a bottom of the lip. The IC is accommodated within the cavity of the cover, and the pressing portions of the cover firmly press on the IC. The tails of the contacts are electrically connected with a burn-in board, thereby electrically interconnecting the IC with the burn-in board. During the burning-in period, a sensor is required to be attached to the IC socket, in order to provide an operator with burn-in data such as a temperature of the ambient environment and a position of the IC engaged on the IC socket.

However, conventional IC sockets do not provide any convenient fastening mechanism for attaching the sensor. The operators may have to resort to using means such as adhesive tape in order to attach the sensor on the IC socket. This does not provide reliable positioning of the sensor, and may reduce the accuracy of the burn-in data.

Hence, a new IC socket which overcomes the above-described disadvantages is desired.

SUMMARY OF THE INVENTION

Accordingly, a primary object of the present invention is to provide an IC socket having a fastening mechanism for easily and conveniently attaching a sensor thereto.

In order to achieve the abovementioned object, an IC socket in accordance with a preferred embodiment of the present invention comprises an insulative housing mounted on a burn-in board, and a plurality of contacts received in the housing. The housing defines a recessed area bounded by two pairs of sidewalls, the recessed area defining a plurality of passageways therein. One of the sidewalls fabricates a receiving channel substantially parallel to an upper surface of the recessed area and a fastening channel substantially perpendicularly communicating with the receiving channel. A bolt is screwed in the fastening channel. When the IC socket is used, a sensor is received in the receiving channel and restricted in the proper position by the bolt screwed in the fastening channel.

Other objects, advantages and novel features of the present invention will become more apparent from the following detailed description when taken in conjunction with the accompanying drawings, in which:

DESCRIPTION OF THE PREFERRED EMBODIMENTS

Figure 1:
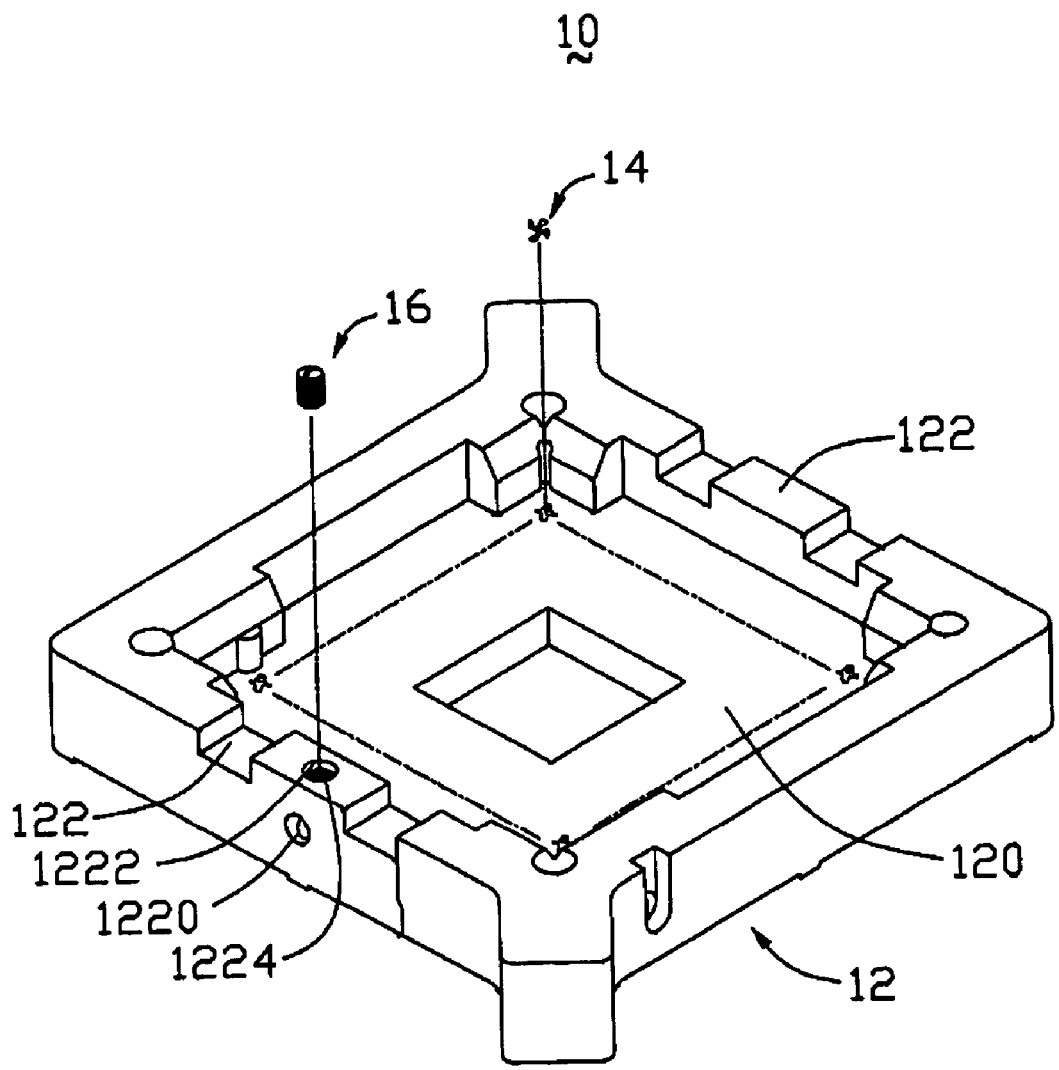
FIG. 1 is a simplified, exploded, isometric view of an IC socket in accordance with the preferred embodiment of the present invention.

Reference will now be made to the drawing figures to describe the present invention in detail.

Figure 2:
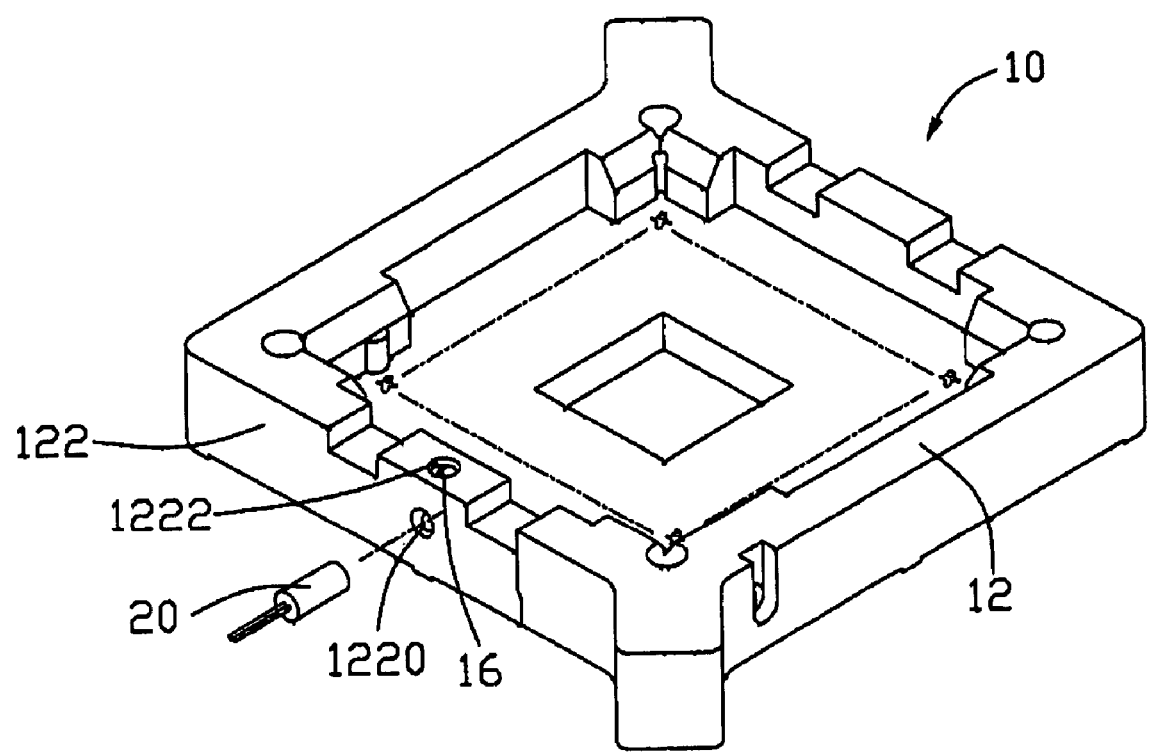
FIG. 2 is an assembled view of FIG. 1, and showing a sensor ready to be attached to the socket.
Figure 3:
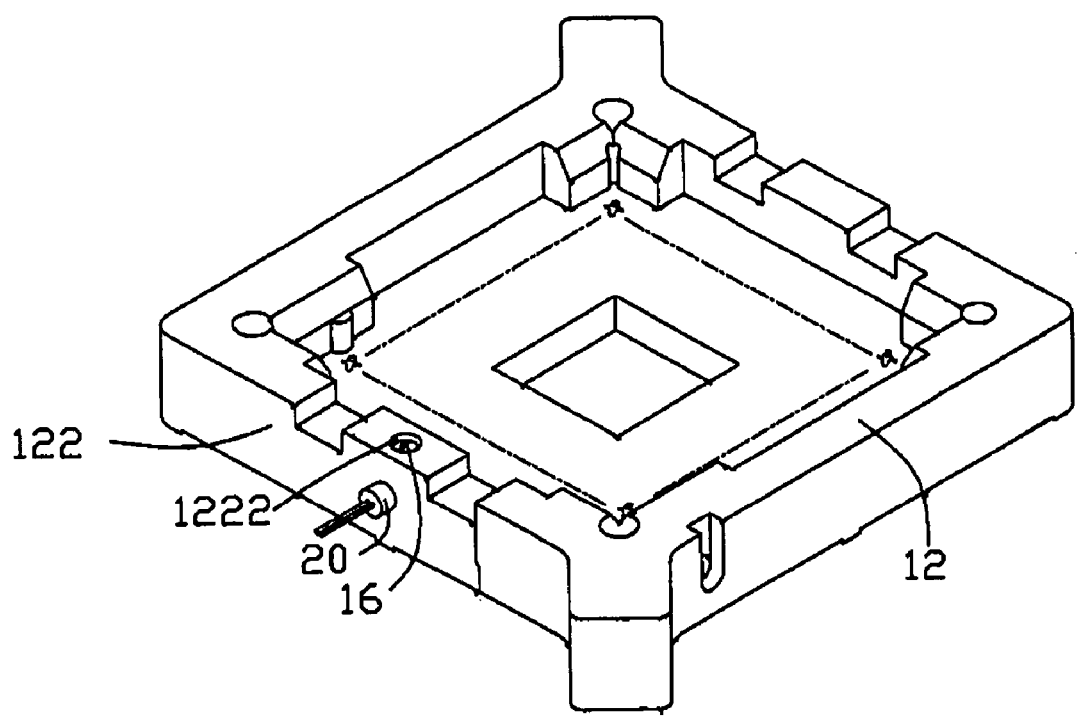
FIG. 3 is similar to FIG. 2, but showing the sensor attached in the socket.
Figure 4:
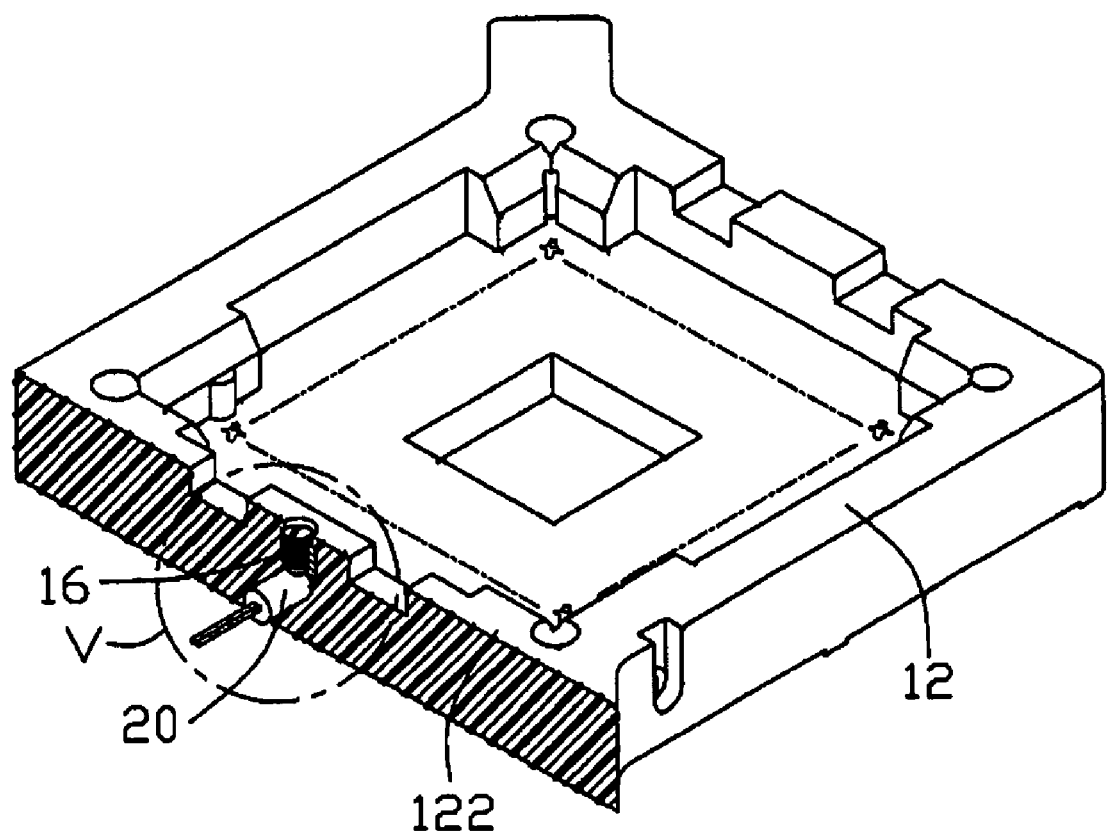
FIG. 4 is similar to FIG. 3, but showing part of a housing of the socket cut away.
Figure 5:
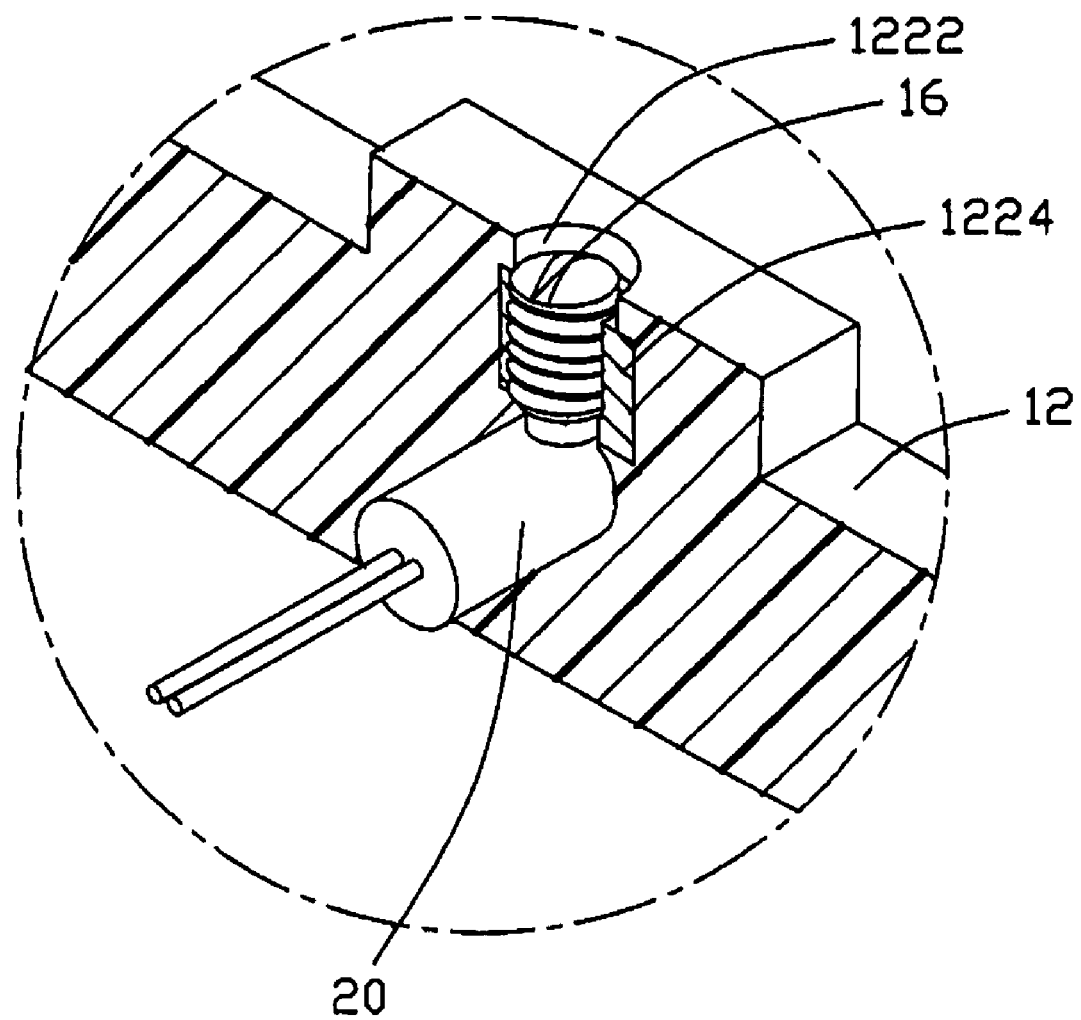
FIG. 5 is an enlarged view of a circled portion V of FIG. 4.

Referring to FIGS. 1–3, an IC socket 10 in accordance with the preferred embodiment of the present invention is adapted to electrically connect an IC (not shown) to a burn-in board (not shown). The IC socket 10 comprises an insulative housing 12, a multiplicity of conductive contacts 14 received in the housing 12, and a bolt 16 screwed in the housing 12. The housing 12 is generally made of plastic material. The housing 12 comprises a recessed area 120 defining a multiplicity of passageways (not labeled) for receiving the contacts 14 therein, and two pairs of sidewalls 122 adjoining and cooperatively surrounding the recessed area 120 wherein a cavity (not labeled) is formed among the sidewalls 122 and above the recessed area 120 for receiving the IC. One of the sidewalls 122 defines a horizontal receiving channel 1220 in a middle portion thereof, and a vertical fastening channel 1222 communicating with the receiving channel 1220. That is, the receiving channel 1220 is substantially parallel to an upper surface of the recessed area 120, and the fastening channel 1222 is substantially perpendicular to said upper surface. A metallic sleeve 1224 is positioned in the fastening channel 1222 by insert molding, the sleeve 1224 having an internal thread. The bolt 16 is screwed in the fastening channel 1222 and engaged with the thread of the sleeve 1224.

Referring to FIGS. 2–5, when the IC socket 10 is used, a sensor 20 is required to attached to the IC socket 10 in order to provide an operator with burn-in data such as a temperature of the ambient environment and a position of the IC engaged on the IC socket 10. In assembly, first the sensor 20 is placed in the receiving channel 1220. Then the bolt 16 is screwed downward until it presses on the sensor 20. Thus, the sensor 20 is tightly held in a proper position by the bolt 16. The bolt 16 is retained in the housing 12 by the thread of the sleeve 1224, which ensures that the bolt 16 remains in position in the housing 12. The sensor 20 is tightly and reliably attached to the IC socket 10. The sleeve 1224 protects said one of the sidewalls 122 from being damaged by the bolt 16.

In alternative embodiments of the present invention, the sleeve 1224 may be made of materials other than metal which have high rigidity. In a further alternative embodiment, the metallic sleeve 1224 is omitted. Instead, the bolt 16 is directly screwed into a narrowed fastening channel of said one of the sidewalls 122. Moreover, if the housing 12 optionally further includes a cover shielding the cavity in operation, the sensor 20 may be built in that cover rather than in the sidewall.

While the present invention has been described with reference to specific embodiments, the description is illustrative of the invention and is not to be construed as limiting the invention. Various modifications to the present invention can be made to the preferred embodiments by those skilled in the art without departing from the true spirit and scope of the invention as defined by the appended claims.

What is claimed is:

1. An IC socket for electrically connecting an integrated circuit module to a printed circuit board comprising:
    an insulative housing defining two pairs of sidewalls, said sidewalls forming a recessed area defining a plurality of passageways therein;
    a plurality of conductive contacts received in corresponding passageways;
    a bolt assembled with the housing; wherein
    one of the sidewalls of the housing forms a receiving channel and a fastening channel communicating with the receiving channel, said bolt is screwed in the fastening channel.

2. The IC socket as described in claim 1, wherein the receiving channel is substantially parallel to an upper surface of the recessed area, and the fastening channel is substantially perpendicular to the upper surface.

3. The IC socket as described in claim 1, further comprising a sleeve inserted in the fastening channel, the sleeve being provided with whorls thereon.

4. The IC socket as described in claim 3, wherein the sleeve is made of metallic material.

5. A socket connector for settling an integrated circuit module therein and connecting a sensor therewith comprising:
    an insulative housing defining two pairs of sidewalls, said sidewalls forming a recessed area defining a plurality of passageways therein;
    a plurality of conductive contacts received in corresponding passageways; and
    a bolt assembled with the housing; wherein
    the housing forms a receiving channel for receiving the sensor therein and a fastening channel for accommodating the bolt therein, and the sensor is restricted in proper position by the bolt in a direction perpendicular to an upper surface of the recessed area.

6. The socket connector as described in claim 5, wherein the receiving channel is substantially parallel to an upper surface of the recessed area, and the fastening channel is substantially perpendicular to the upper surface.

7. The socket connector as described in claim 5 further comprising a sleeve inserted in the fastening channel, the sleeve being provided with whorls thereon.

8. The socket connector as described in claim 7, wherein the sleeve is made of metallic material.

9. An IC socket assembly for electrically connecting an integrated circuit module to a printed circuit board comprising:
    an insulative housing defining a cavity located above a recessed area for receiving said integrated circuit module;
    a plurality of passageways defined in the recessed area;
    a plurality of conductive contacts received in corresponding passageways for connecting to the integrated circuit module;
    a receiving channel formed in the housing to communicate the cavity with an exterior;
    a detecting device received in the receiving channel with a wire connected to an external device located in the exterior.

10. The assembly as described in claim 9, wherein said detecting device senses temperatures.

11. The assembly as described in claim 10, wherein said cavity is surrounded by plural sidewalls.

12. The assembly as described in claim 11, wherein said receiving channel extends horizontally through one of said sidewalls.

13. The assembly as described in claim 9, wherein a fastening device is fixed to the housing and fastens the detecting device in position in the housing.

14. The assembly as described in claim 13, wherein said cavity is surrounded by plural sidewalls, a fastening channel is formed in said sidewalls in communication with the receiving channel, and said fastening device is fastened into the fastening channel and retainably engages the detecting device.

* * * * *